United States Patent [19]
Kim et al.

[11] Patent Number: 6,079,358
[45] Date of Patent: Jun. 27, 2000

[54] APPARATUS FOR FORMING THIN FILM

[75] Inventors: Dae-Won Kim; Sang-Soon Bae, both of Taejon, Rep. of Korea

[73] Assignee: SK Corporation, Seoul, Rep. of Korea

[21] Appl. No.: 09/185,829

[22] Filed: Nov. 4, 1998

[30] Foreign Application Priority Data

Nov. 5, 1997 [KR] Rep. of Korea ............ 97-58246

[51] Int. Cl.[7] .................. C23C 16/00; C23F 1/02
[52] U.S. Cl. .................. 118/723 E; 118/723 R; 156/345
[58] Field of Search .......... 118/723 E, 723 ER, 118/723 R, 723 I, 723 IR, 728, 504; 156/345; 204/298.06, 298.11, 298.15, 298.34

[56] References Cited

U.S. PATENT DOCUMENTS

| | | | |
|---|---|---|---|
| 5,383,984 | 1/1995 | Shimada et al. | 156/345 |
| 5,515,986 | 5/1996 | Turlot et al. | 216/71 |
| 5,529,657 | 6/1996 | Ishii | 156/345 |
| 5,658,417 | 8/1997 | Watanabe et al. | 156/345 |
| 5,795,452 | 8/1998 | Kinoshita et al. | 204/298.37 |

*Primary Examiner*—Thi Dang
*Assistant Examiner*—Luz Alejandro
*Attorney, Agent, or Firm*—Seidel, Gonda Lavorgna & Monaco, PC

[57] ABSTRACT

An apparatus for forming a thin film comprises a housing defining a reaction chamber; a pair of electrodes securely fixed in the reaction chamber of the housing such that they are spaced from each other by a predetermined distance; and a plasma carrier detachably disposed between the pair of electrodes and having at least one substrate assembled thereto, the plasma carrier and at least one substrate cooperating with each other to delimit a glow discharge space, the plasma carrier being formed with a plurality of gas intake holes and a plurality of gas exhaust holes for communicating the glow discharge space with the outside. According to the present invention, in a plasma chemical vapor deposition device, a glow discharge space is delimited by a plasma carrier, whereby a cleansing procedure is simplified and productivity is enhanced while advantages of a box carrier type plasma chemical vapor deposition device are afforded.

19 Claims, 10 Drawing Sheets

APPARATUS FOR FORMING THIN FILM

BACKGROUND OF THE INVENTION

1. Field of the Invention

The present invention relates to an apparatus for forming a thin film, and more particularly, to an apparatus for forming a thin film, belonging to a plasma chemical vapor deposition device, which delimits a glow discharge space by a plasma carrier to thereby simplify a cleansing procedure and enhance productivity while affording advantages of a box carrier type plasma chemical vapor deposition device.

2. Description of the Prior Art

Generally, since a plasma chemical vapor deposition device carries out almost all of its processes at a relatively low temperature and can produce a uniform thin film over a large area, it is widely used in fabricating or forming a semiconductor or an insulating layer which is needed for manufacturing a semiconductor integrated circuit, a thin film transistor liquid crystal display (TFT LCD), a solar cell, etc.

As a plasma chemical vapor deposition device suitable for mass production, several devices of various types including box carrier type, roll-to-roll type, in-line type and plasma box type have been developed. Among these devices, the box carrier type plasma chemical vapor deposition device is advantageous in an economical viewpoint as compared to the others in that it is inexpensive, it has a high productivity due to its processing of parts by a batch unit, and the utilization efficiency of a plasma gas is elevated.

Referring to FIG. 1, there is illustrated a cross-sectional view of an apparatus for forming a thin film, of the prior art.

A box carrier 10 of the apparatus for forming a thin film, of the prior art, has a glow discharge space 14 delimited by a radio frequency (RF) electrode 11 and ground electrodes 12 and 13, a plasma gas intake space 15 for supplying a plasma gas into the glow discharge space 14, and a reaction gas exhaust space 16 for ejecting a reaction gas from the glow discharge space 14.

Four substrates 17 on each of which a thin film is to be grown are mounted against both surfaces of the RF electrode 11 and inner surfaces of the ground electrodes 12 and 13, respectively, in a state that the ground electrodes 12 and 13 are moved to an open position. After the substrates 17 are mounted as described above, the ground electrodes 12 and 13 are moved to a closed position, and the box carrier 10 is pushed into a reaction chamber (not shown).

The reaction chamber is maintained at a constant temperature and under a constant pressure, and the plasma gas and RF power are supplied to the box carrier 10.

For example, in case of a solar cell, p, i and n layers made of amorphous silicon are continuously grown. $SiH_4$ is mainly used as the plasma gas for a thin film made of amorphous silicon, and $B_2H_6$ and $PH_3$ are added as doping gases when forming the p layer and the n layer, respectively.

By applying an RF power of 13.56 MHZ to the RF electrode 11 while supplying the plasma gas into the box carrier 10, glow discharge occurs in the glow discharge space 14, and according to this, a thin film is grown on an inner surface of the box carrier 10 facing the glow discharge space 14 and on inner surfaces of the substrates 17. After the reaction is completed, the box carrier 10 is drawn out of the reaction chamber, the ground electrodes 12 and 13 are moved again to the open position, and the substrates 17 are taken out.

At this time, the thin film coated onto the inner surface of the box carrier 10 is peeled off, floated in the reaction chamber in the form of particles and adhered to substrates 17 onto which thin films are to be newly formed, thereby causing flaws in the substrates 17. For this reason, the used box carrier 10 is disassembled and cleansed. An a-Si thin film coated onto the inner surface of the box carrier 10 is removed by impregnating the box carrier 10 with alkaline solution such as KOH for a lengthy period of time. The box carrier 10 stained with the alkaline solution is cleaned by deionized water. After removing the deionized water from the inner surface of the box carrier 10 by employing dried air or nitrogen, the box carrier 10 is completely dried in a drying furnace.

However, the apparatus for forming a thin film of the prior art, constructed as mentioned above, suffers from defects in that a great deal of time and human effort are required for disassembling and cleansing the box carrier, it costs a great deal to prepare utilities such as deionized water, nitrogen, electric power, etc. and treat the alkaline solution. Also, while it is economical to pursue mass production to reduce the price of an end product, and a typical way to enhance productivity of a plasma chemical vapor deposition procedure is to enlarge an area of a substrate and automate various processes, the box carrier of the plasma chemical vapor deposition device of the prior art is greatly involved in mounting/dismounting the substrates, loading the box carrier and disassembling/cleansing/assembling the box carrier, so that it is not suited for mass production. Further, in case of enlarging the area of the substrate, the electrodes constituting a main portion of the box carrier must readily conduct electric current and must not be corroded while being cleansed with the alkaline solution, for which reason the electrodes are made of stainless steel, an area of the electrode must be larger than the area of the substrate to obtain a uniform thin film over the entire substrate, and a distance between the electrodes must be kept constant. Accordingly, as the area of the substrate is enlarged, since the area of the electrode is also enlarged and a thickness thereof must also be increased to prevent deformation due to heat or outside shock, the more the area of the substrate is enlarged, the more the size and weight of the box carrier are increased, whereby it is more difficult to properly handle the box carrier.

SUMMARY OF THE INVENTION

Accordingly, the present invention has been made in an effort to solve the problems occurring in the prior art, and an object of the present invention is to provide an apparatus for forming a thin film, which has a simple structure, requires a low cost for maintenance and service thereof, can be easily automated for mass production to enhance productivity and to reduce the price of an end product, and allows a number of processes to be smoothly performed when length and weight are increased as an area of a substrate is enlarged.

In order to achieve the above object, according to the present invention, there is provided an apparatus for forming a thin film, comprising: a housing defining a reaction chamber; a pair of electrode means securely fixed in the reaction chamber of the housing such that they are spaced from each other by a predetermined distance; and a plasma carrier detachably disposed between the pair of electrode means and having at least one substrate assembled thereto, the plasma carrier and the at least one substrate cooperating with each other to delimit a glow discharge space, the plasma carrier being formed with a plurality of gas intake holes and a plurality of gas exhaust holes for communicating the glow discharge space with the outside.

BRIEF DESCRIPTION OF THE DRAWINGS

The above objects, and other features and advantages of the present invention will become more apparent after a reading of the following detailed description taken in conjunction with the drawings, in which:

FIG. 6b is an enlarged sectional view of the circle B of FIG. 6a;

DETAILED DESCRIPTION OF PREFERRED EMBODIMENTS

Figure 1:
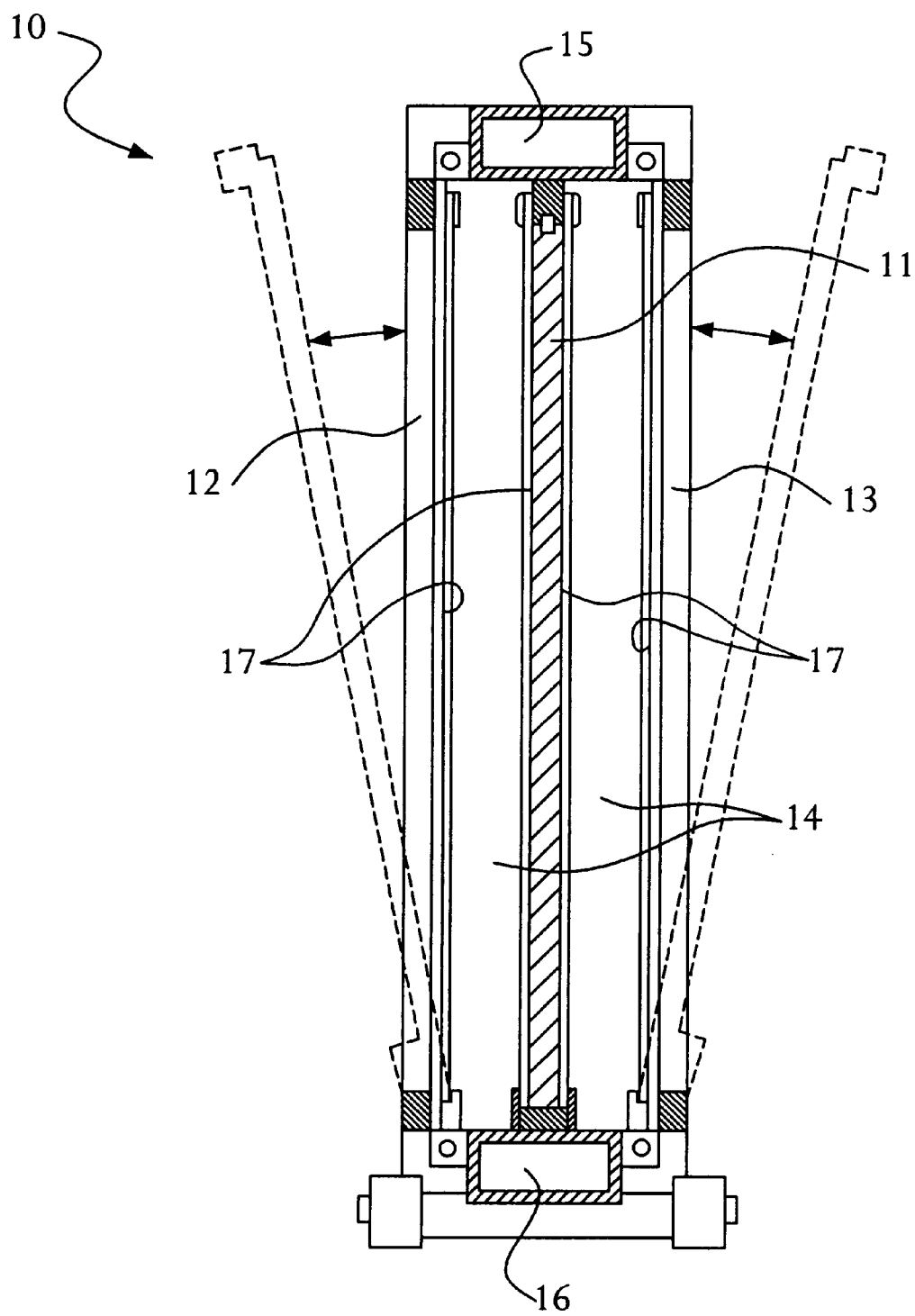
FIG. 1 is a cross-sectional view illustrating an apparatus for forming a thin film, of the prior art.
Figure 2:
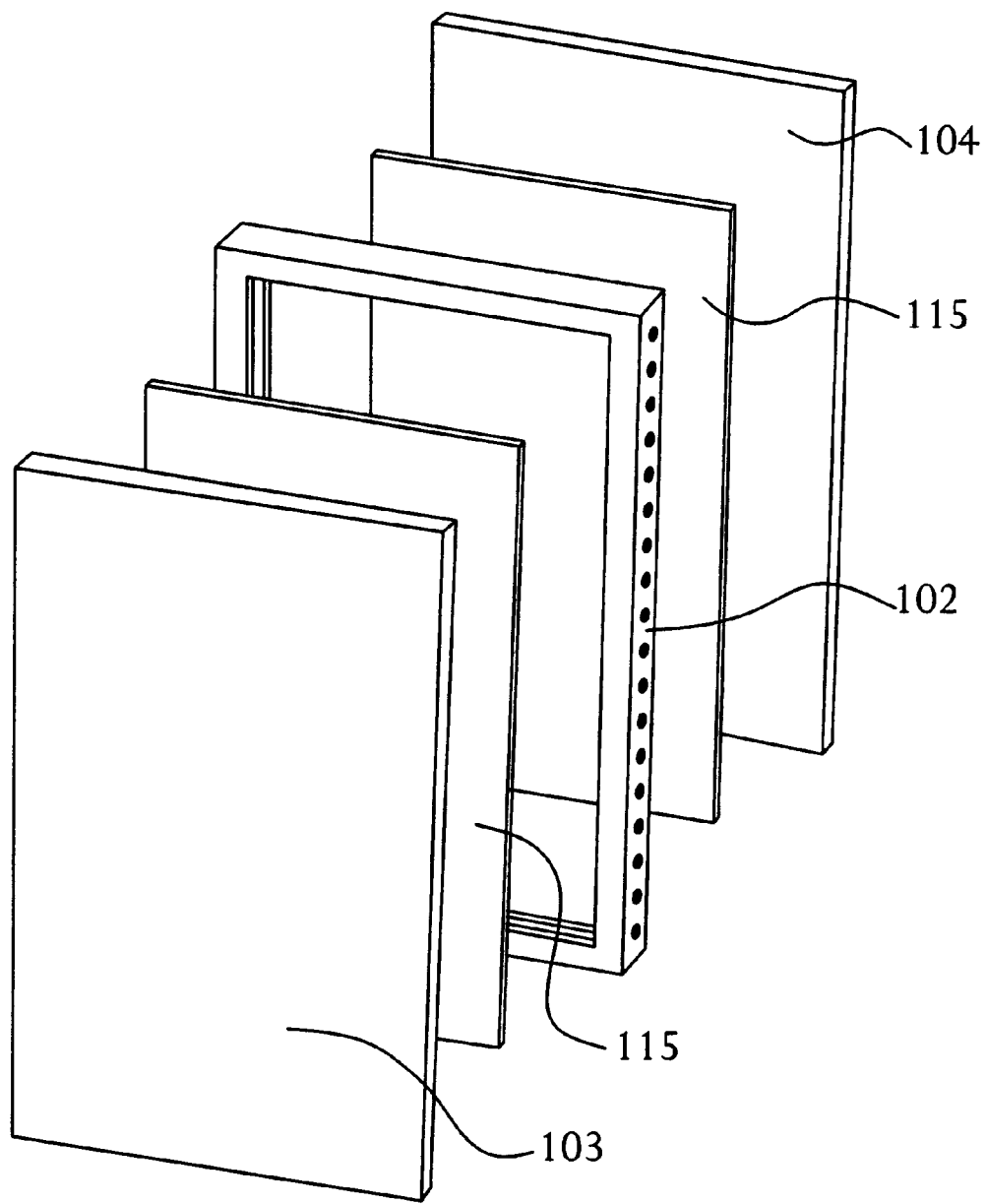
FIG. 2 is an exploded perspective view illustrating a plasma carrier, substrates and electrodes.
Figure 3:
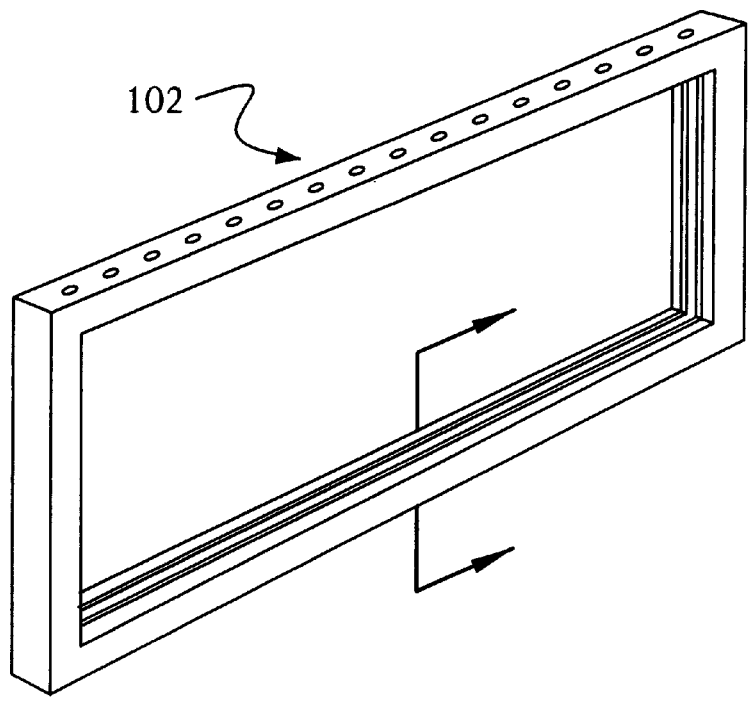
FIG. 3 is a perspective view of the plasma carrier of FIG. 2.
Figure 4:
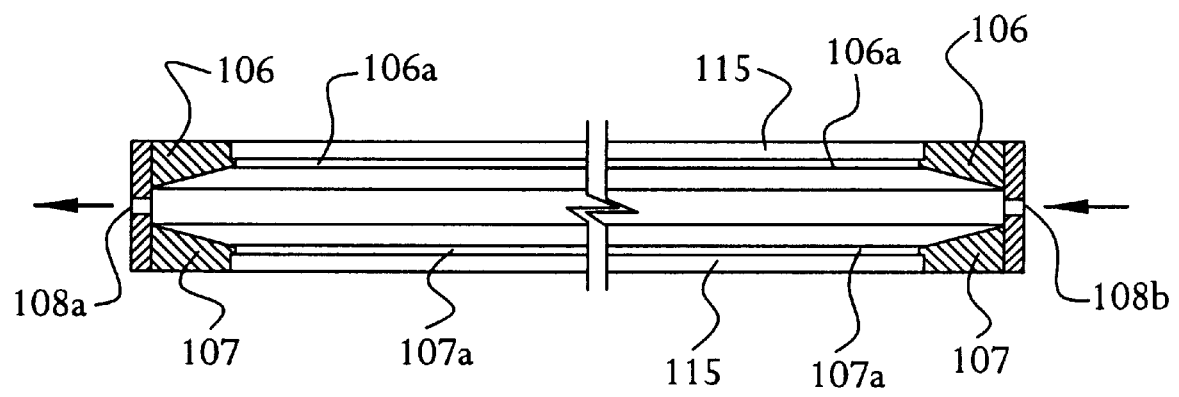
FIG. 4 is a transverse-sectional view of the plasma carrier of FIG. 3.
Figure 5:
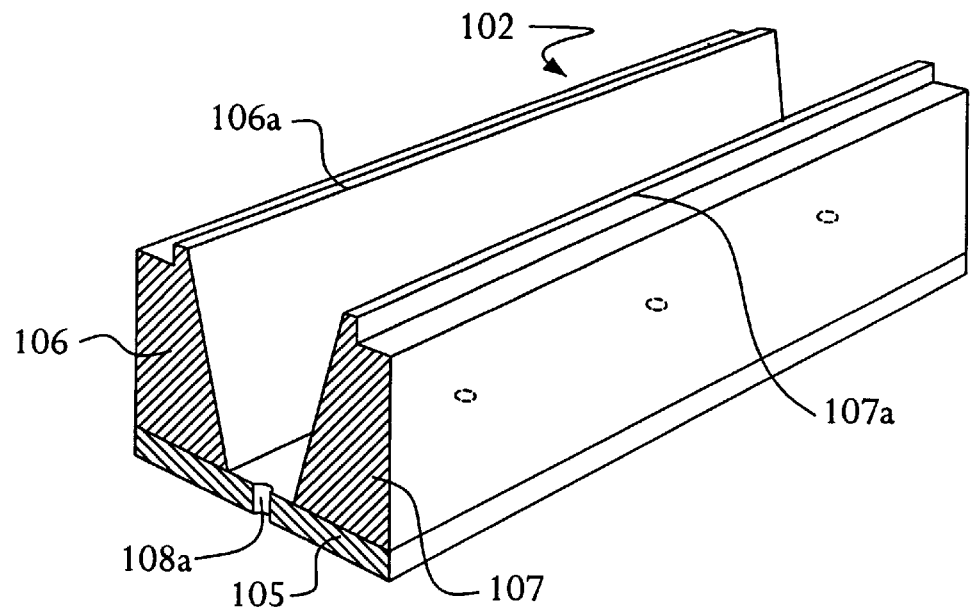
FIG. 5 is a partially-sectioned enlarged perspective view taken along the line A—A of FIG. 3.

Reference will now be made in greater detail to a preferred embodiment of the invention, an example of which is illustrated in the accompanying drawings. Wherever possible, the same reference numerals will be used throughout the drawings to refer to the same or like parts.

Referring to FIGS. 2 through 7, there is illustrated an apparatus for forming a thin film in accordance with an embodiment of the present invention.

The apparatus 100 according to the present invention includes a housing defining a reaction chamber 101, a plasma carrier 102 and a pair of electrodes 103 and 104.

The pair of electrodes 103 and 104 are securely fixed in the reaction chamber 101 of the housing such that they are spaced from each other by a predetermined distance. The housing is formed with a gas inlet passage and a gas outlet passage (not shown) which are communicated with the reaction chamber 101.

The plasma carrier 102 is detachably disposed between the pair of electrodes 103 and 104 in the reaction chamber 101. The plasma carrier 102 cooperates with substrates 115 to delimit a glow discharge space 120. The plasma carrier 102 is formed with a plurality of gas intake holes 108b and a plurality of gas exhaust holes 108a which communicate the glow discharge space 120 with the outside. It is preferable that the plurality of gas intake holes 108b and the plurality of gas exhaust holes 108a are opposite each other, respectively, and the cross-section and the number of the gas intake holes 108b are equal to those of the gas exhaust holes 108a.

A portion of the plasma carrier 102 is made of conductive material such as metal. Preferably, the plasma carrier 102 has a rectangular hoop-shaped configuration and comprises a conductive element 105 and a pair of insulating elements 106 and 107. The conductive element 105 is electrically connected to a grounded electrode of the pair of electrodes 103 and 104 and is electrically insulated from a power-supplied electrode of the pair of electrodes 103 and 104 when the plasma carrier 102 and the substrates 115 are mounted between the pair of electrodes 103 and 104.

The pair of electrodes 103 and 104 have a plate-shaped configuration and are arranged such that they are parallel to each other. The pair of electrodes comprises an RF electrode 103 and a ground electrode 104.

It is preferred that the insulating elements 106 and 107 of the plasma carrier 102 are made of ceramic, heat-resistant plastic, or glass.

The substrates 115 are assembled against a substrate supporting member 112. Also, the substrates 115 are mounted or dismounted between the pair of electrodes 103 and 104 in a state that they are assembled to the plasma carrier 102.

Two substrates 115 are electrically insulated from each other by the plasma carrier 102 so that they can be used in an RF plasma chemical vapor deposition device of a capacity-coupling type.

The conductive element 105, which is a planar plate having a predetermined width, constitutes a base of the plasma carrier 120. The conductive element 105 has a plurality of gas intake holes 108b and a plurality of gas exhaust holes 108a which are formed therethrough in a lengthwise direction such that they are opposite each other, respectively. The insulating elements 106 and 107, each having a trapezoidal cross-section, are fixedly coupled to an inner surface of the conductive element 105.

The plurality of gas intake holes 108b and the plurality of gas exhaust holes 108a are formed for supplying a plasma gas into the reaction chamber 101 and for ejecting a reaction gas from the reaction chamber 101, respectively. Positive ions having a great energy exist in a plasma zone. Since the inner surface of the plasma carrier 102 is exposed to a contact with the positive ions, if oxygen or nitrogen is left in the reaction chamber 101 after the reaction chamber 101 is evacuated, the oxygen or nitrogen acts as impurities and can deteriorate properties of a thin film. Accordingly, porous material capable of absorbing gas molecules to a great extent cannot be used as material for the plasma carrier 102. Also, since the inner surface of the plasma carrier 102 is exposed to glow discharge, namely plasma, material for the plasma carrier 102 must be stable in the plasma.

It is preferred that the plasma gas supplied through the plurality of gas intake holes 108b includes at least one compound of silicon and halogen element, such as $SiH_4$, $Si_2H_6$, $SiF_4$ or $SiH_2Cl_2$.

Figure 6A:
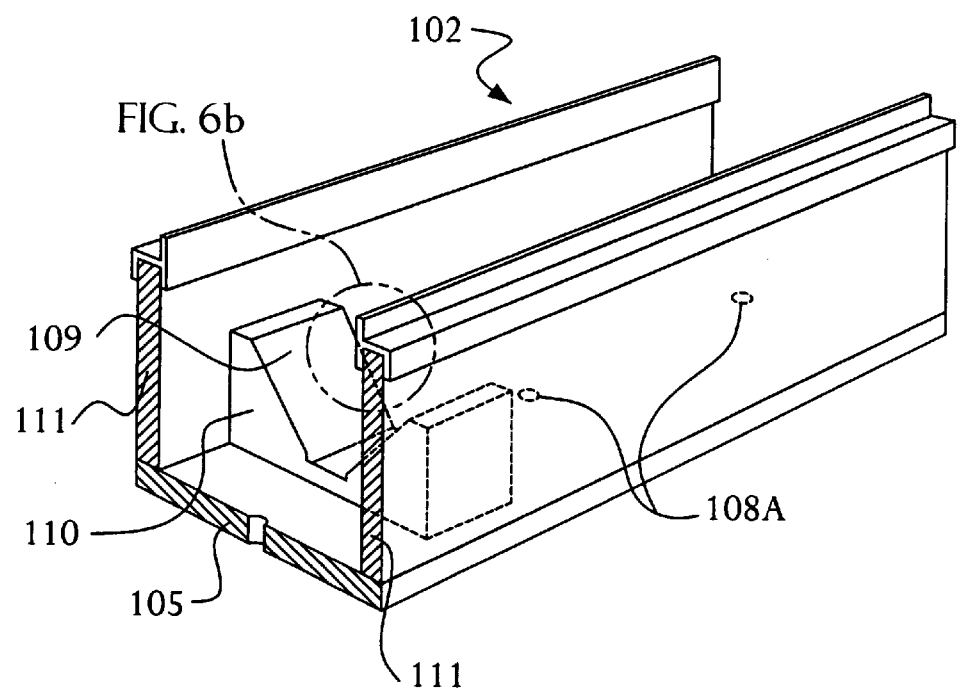
FIG. 6a is a partially-sectioned enlarged perspective view for a plasma carrier in accordance with another embodiment of the present invention.

The insulating elements 106 and 107 have a predetermined width and length, and are fixedly coupled to the inner surface of the conductive element 105 such that they are arranged perpendicularly to the inner surface of the conductive element 105 and they are opposite each other. Projections 106a and 107a, each having a predetermined width, are projectedly formed at distal ends of the insulating elements 106 and 107, respectively, along a lengthwise direction thereof. While Macor manufactured by Coning Glass Work and Vespel manufactured by Dupont can be used as favorable material for the insulating elements 106 and 107, since they are expensive and are susceptible to breakage, they can be substituted by a glass plate 111 of low price, as shown in FIG. 6a. In other words, a plurality of supporting segments 110 each having a V-shaped recess 109 formed on one surface thereof are fixedly coupled to the inner surface of the conductive element 105 at a desired position, and proximal ends of glass plates 111 each having a predetermined width and length are fixedly coupled to the conductive element 105 such that they are arranged perpendicularly to the inner surface of the conductive element 105, with one surfaces of the glass plates 111 being brought into close contact with side surfaces of the supporting segments 110.

That is, the supporting segments 110 are fixedly disposed between the glass plates 111 of the plasma carrier 102 such that they are spaced from each other by a predetermined distance to support the glass plates 111, while each supporting segment 110 has the configuration of hexahedron having the V-shaped recess 109.

Figure 6B:
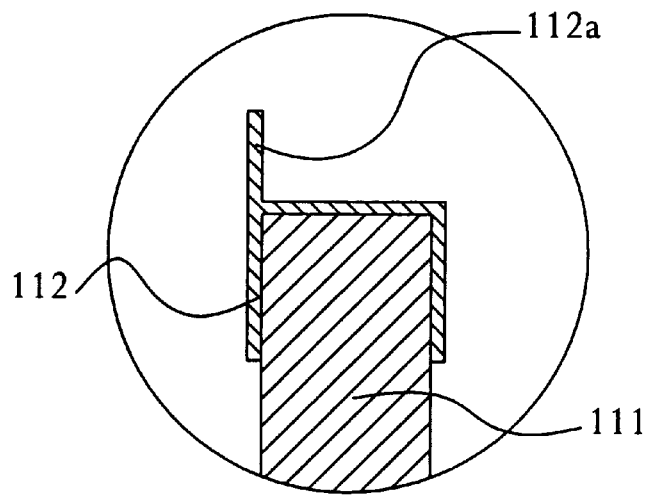
Figure 6C:
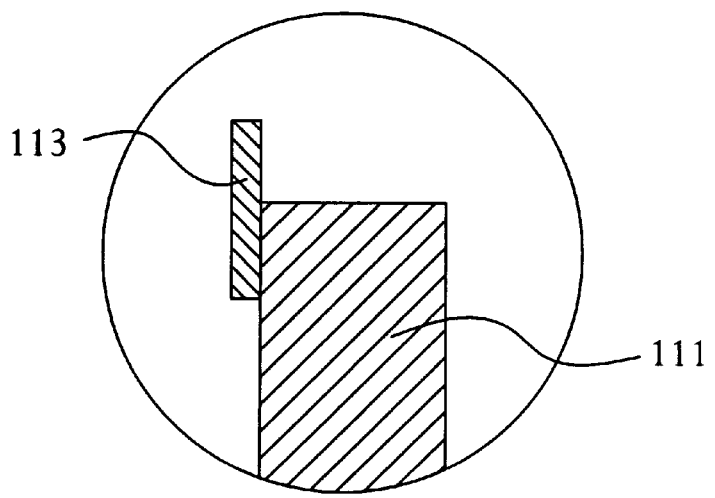
FIG. 6c is an enlarged sectional view illustrating a glass piece attached to a glass plate in accordance with another embodiment of the present invention.
Figure 7:
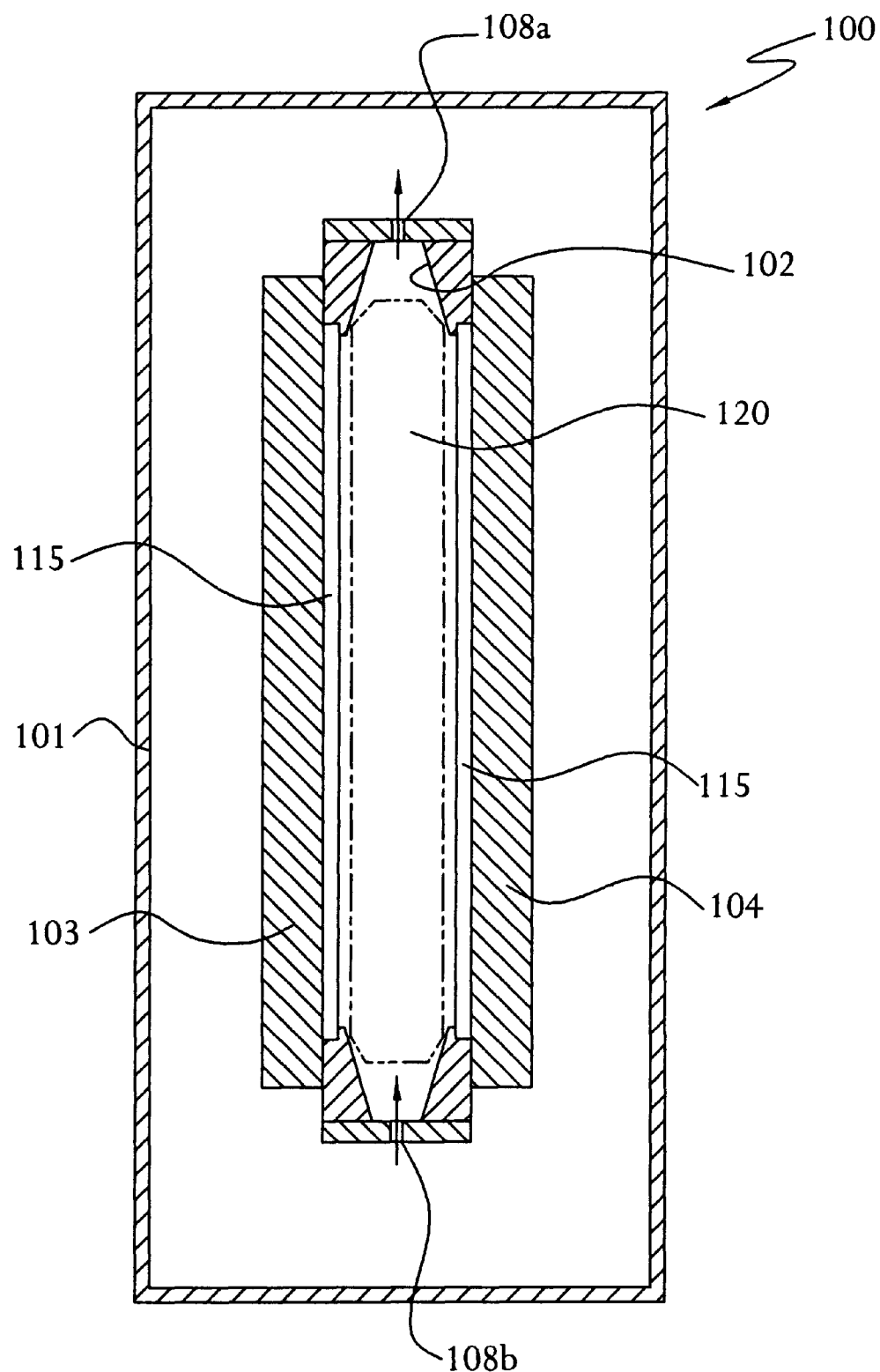
FIG. 7 is a cross-sectional view showing a state in which an apparatus for forming a thin film according to the present invention is operated.

As shown in FIGS. 6b and 6c, substrate supporting members 112 made of metal may be fitted to distal ends of the glass plates 111, or glass pieces 113, each having a predetermined width and length, are securely attached to inner surfaces of the distal ends of the glass plates 111 to provide a substrate supporting structure.

Each substrate supporting member 112 has an h-shaped cross-section to be fitted to the distal end of the glass plate 111. Protrusions 112a each having a predetermined width are projectedly and upwardly formed at an upper surface of the substrate supporting members 112, respectively.

The substrates 115 are assembled to both sides of the plasma carrier 102 constructed as mentioned above. That is, the substrate 115 is seated onto the substrate supporting structure to be assembled thereto.

Since outer surfaces of the two substrates 115 come into contact with the RF electrode 103 and ground electrode 104, respectively, the plasma carrier 102 has to electrically insulate the two substrates 115 from each other. Also, since the substrates 115 are generally heated to a temperature not greater than 300° C. in a plasma chemical vapor deposition procedure, the plasma carrier 102 must stable at that temperature and not greater than 300° C. In other words, the distance between the substrates 115 must not be changed even under severe contraction or expansion, and an out-gassing phenomenon, by which impurities are generated, must be prevented. This is because the distance between the substrates 115 must be kept constant in order to repeatedly form a uniform thin film over a wide area and the impurities generated by the out-gassing phenomenon deteriorate the property of the thin film.

Figure 8:
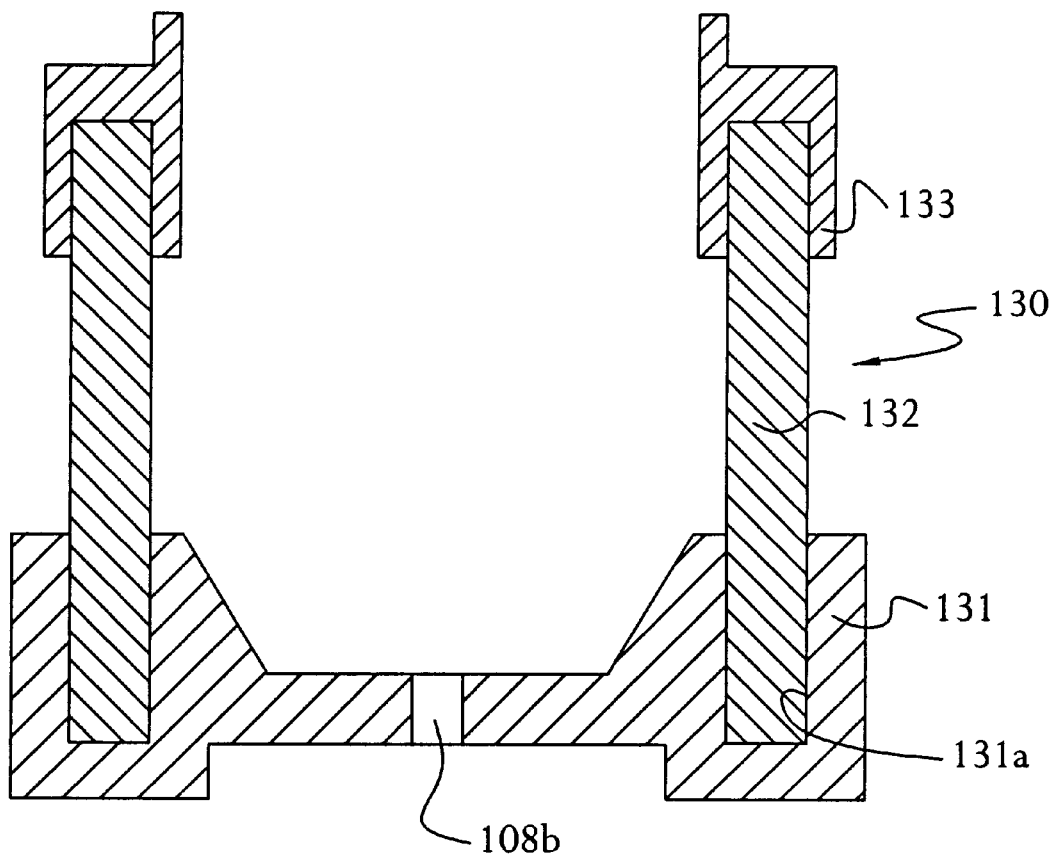
FIG. 8 is a cross-sectional view illustrating a plasma carrier in accordance with still another embodiment of the present invention.

Referring to FIG. 8, there is illustrated a cross-sectional view for a plasma carrier in accordance with still another embodiment of the present invention. This embodiment of the present invention is designed for providing convenience upon manufacturing and handling a plasma carrier 130. A frame 131 constituting the plasma carrier 130 is made by extruding aluminum. Each end of the frame 131 is formed with a depression 131a into which a proximal end of a glass plate 132 is fitted, and a substrate supporting member 133 made of Teflon is fitted to a distal end of the glass plate 132, to thereby define the plasma carrier 130.

Figure 9:
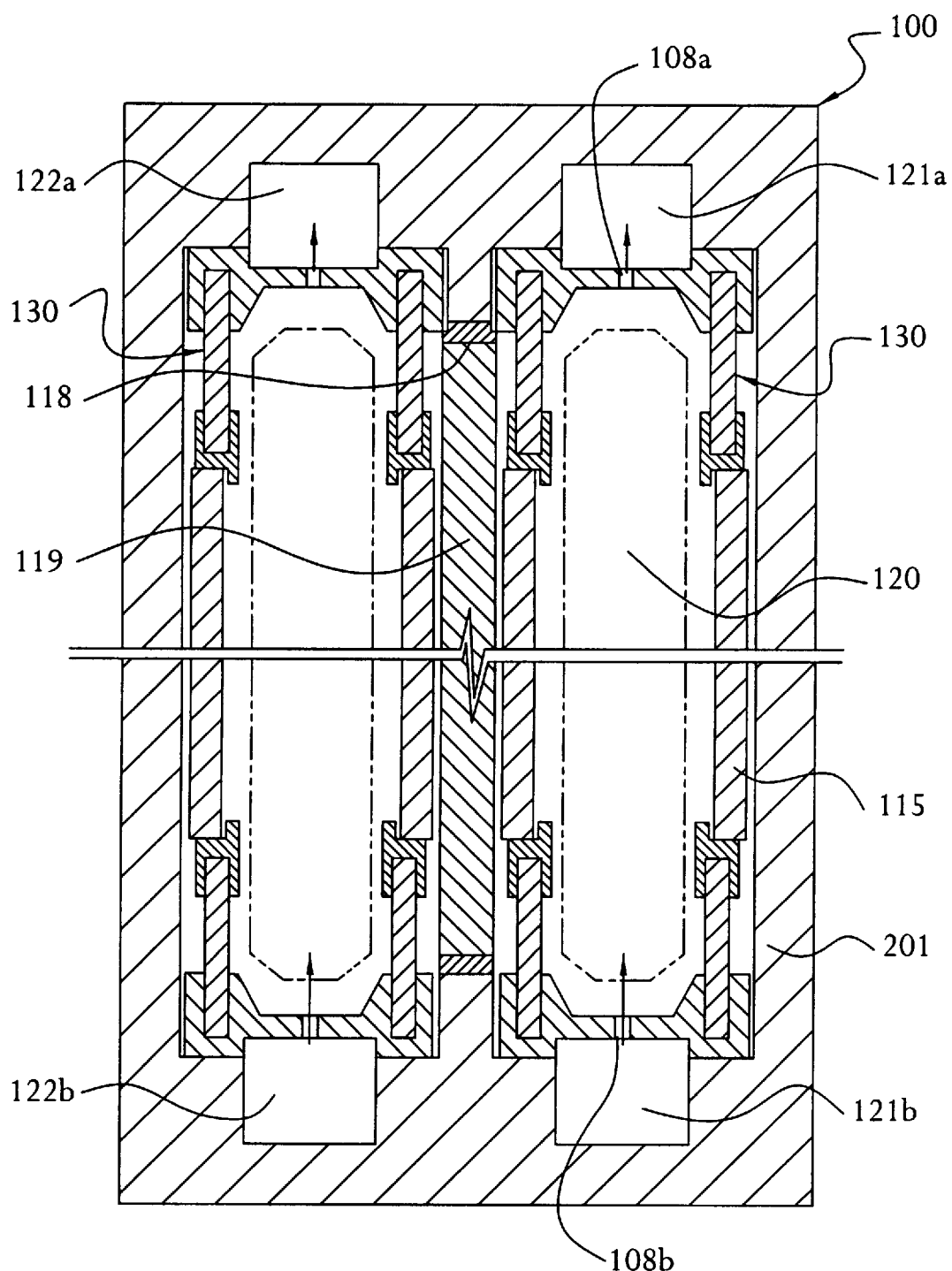
FIG. 9 is a cross-sectional view showing a state in which the plasma carrier of FIG. 8 is mounted in a reaction chamber of the apparatus according to the present invention.

As shown in FIG. 9, which shows a state in which the plasma carrier of FIG. 8 is mounted in a reaction chamber of the apparatus according to the present embodiment, a housing, which is grounded and defines a reaction chamber 201 functions as a ground electrode, and the plasma carrier 130 is electrically grounded by being brought into contact with the housing defining the reaction chamber 201. An RF electrode 119 to which an RF power is supplied is fixedly disposed in the reaction chamber 201 in a state that it is insulated from the housing by an insulator 118. Since gas intake spaces 121b and 122b and gas exhaust spaces 121a and 122a, which are remaining spaces of the reaction chamber 201 when excluding a glow discharge space 120, are surrounded by the grounded housing and the plasma carrier 130, glow discharge and deposition of a thin film do not occur in the gas intake spaces 121b and 122b and the gas exhaust spaces 121a and 122a.

Comparisons were made for thickness uniformity of thin films made of amorphous silicon, with the thin films being formed by using a plasma carrier and a box carrier. Here, the dimensions of the substrate 115 were 305 mm×915 mm×3 mm (width×length×thickness), Sodalime glass is used, and forming conditions are as presented in Table 1.

TABLE 1

| Conditions | | Specifications |
| --- | --- | --- |
| Temp. of Reaction Chamber | | 200° C. |
| Pres. of Reaction Chamber | | 0.3 Torr |
| Flow Rate of | $SiH_4$ | 80 sccm |
| Reaction Gas | $H_2$ | 40 sccm |
| RF Power | | 30 W |
| Deposition Time | | 60 min |

Thickness distributions were measured for a sample of 305 mm×915 mm×3 mm in a direction toward a short edge portion thereof. Also, a center portion and both end portions were measured in a direction toward a long edge thereof. Both end portions were measured at a position separated from the long edge portion by 20–30 mm. By removing a thin film made of amorphous silicon by using an Nd:YAG laser at a point where a thickness measurement is to be performed and by measuring section heights by a Surface Profiler, thickness measurements were obtained. The measurement results are illustrated in a comparative graph of FIG. 10.

Figure 10:
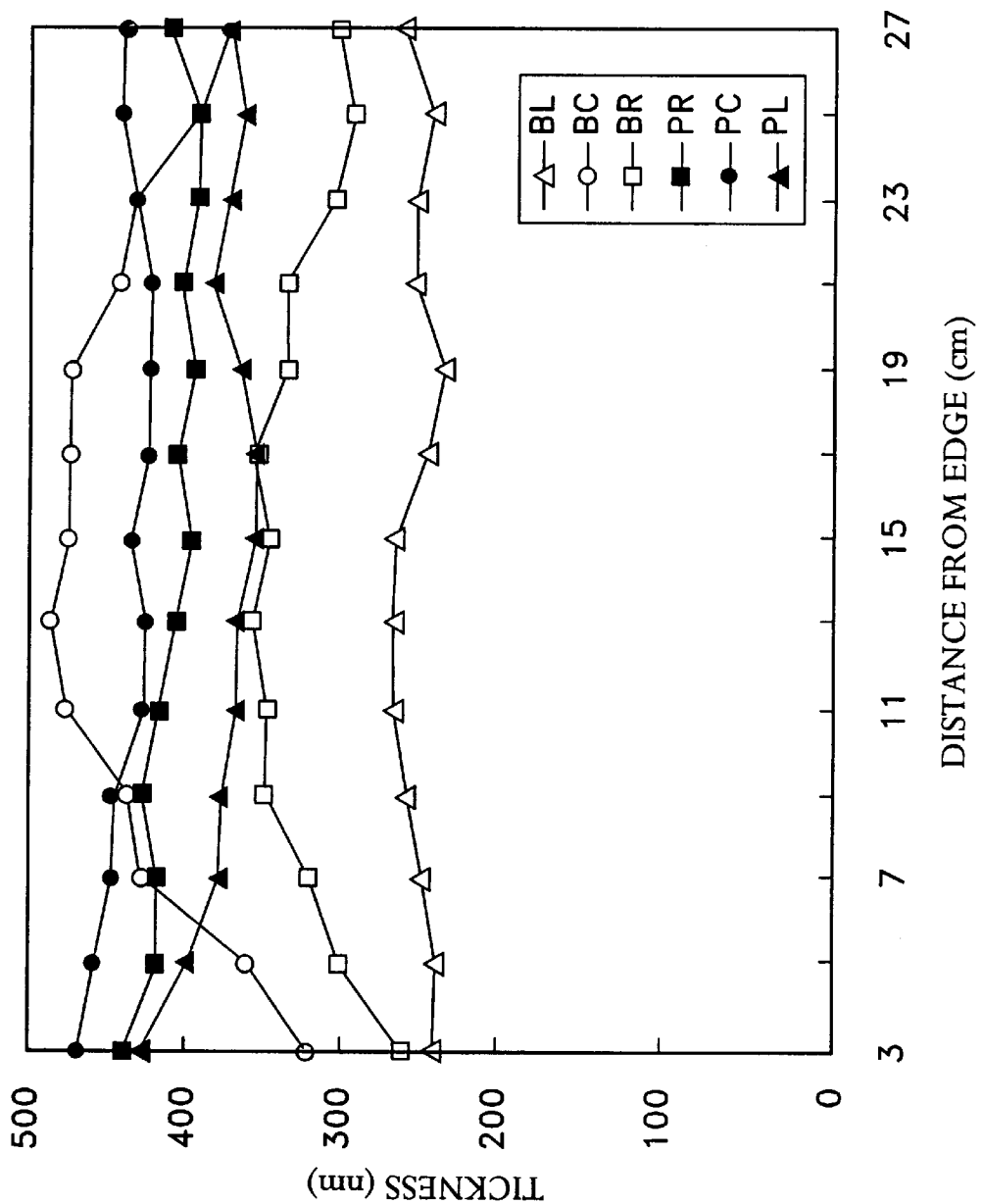
FIG. 10 is a graph showing a relationship between thickness measurements for films formed using a box carrier or the plasma carrier and distance from an edge of the films.

In the graph of FIG. 10, first characters B and C denote the box carrier and the plasma carrier, respectively, and second characters L, C and R denote the left end portion, the center portion and the right end portion of the sample, respectively.

Thickness uniformity of the sample prepared using the plasma carrier was ±13%, and that of the sample prepared using the box carrier was ±34%. Therefore, it is to be readily understood that the plasma carrier is a thing of remarkable improvement in thickness uniformity as compared to the box carrier. This is due to the fact that, in case of the plasma carrier, since electrodes are separately and securely fixed in the reaction chamber, it is easier to keep the distance between the electrodes uniform and constant when compared to the box carrier.

Figure 11:
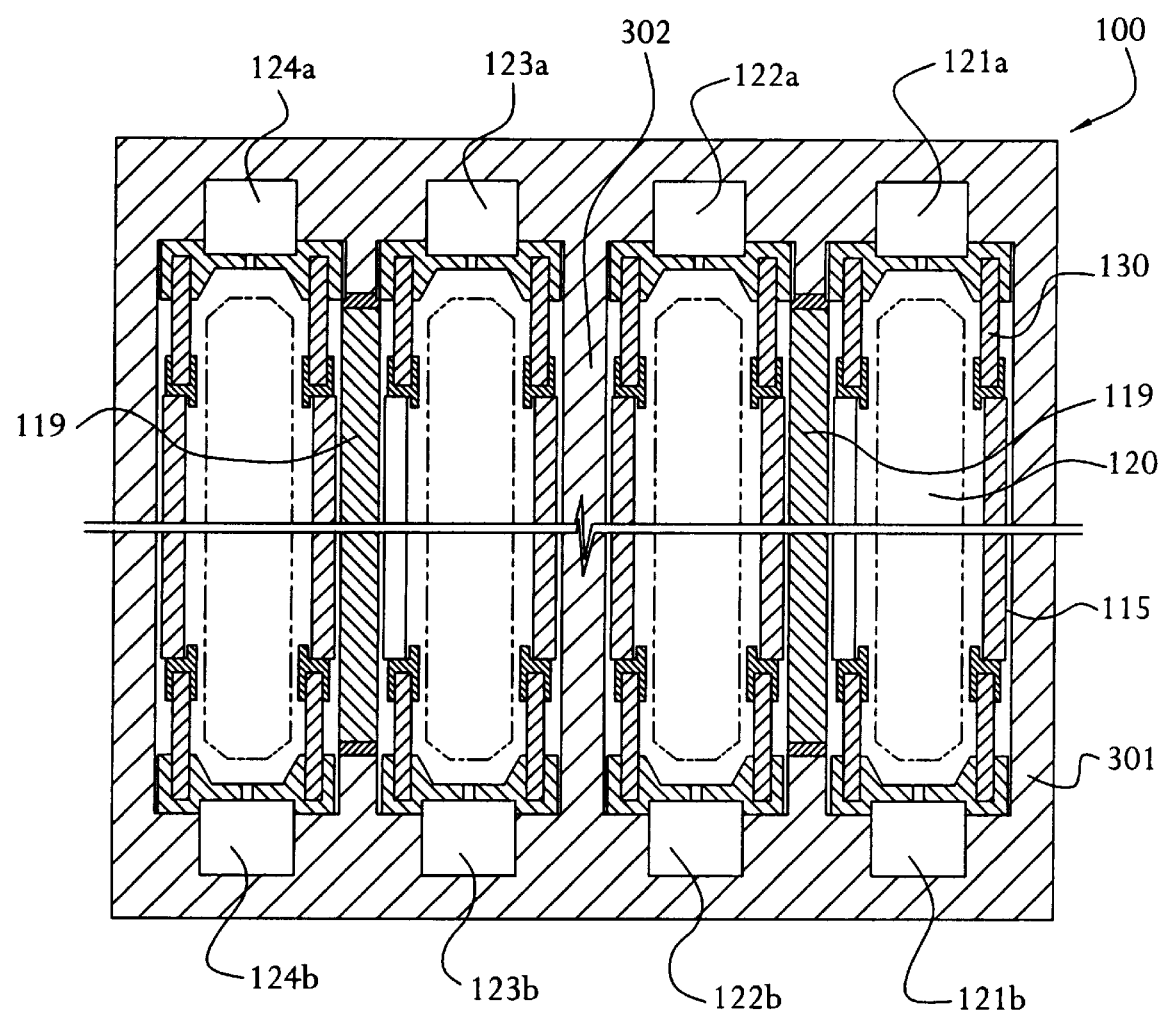
FIG. 11 is a cross-sectional view showing a state in which a plurality of plasma carriers are mounted in a reaction chamber in accordance with yet still another embodiment of the present invention.

Referring to FIG. 11, a plurality of ground electrodes 302 and a plurality of RF electrodes 119 are alternately arranged in a reaction chamber 301, respectively, to allow a plurality of plasma carriers 130 to be mounted therein, whereby productivity is enhanced.

As a result, by an apparatus according to the present invention, advantages are provided in that since a plasma carrier and substrates thoroughly separate a glow discharge space and a reaction chamber from each other, impurities existing in the reaction chamber are prevented from flowing into the glow discharge space to deteriorate the properties of a thin film which is to be grown onto the substrates. Also, since it is not necessary to cleanse a housing which defines the reaction chamber in a plasma chemical vapor deposition device and instead, it is only required to cleanse a substrate supporting and conveying mechanism having a simple and compact structure, time, utilities and human effort needed for the cleansing process can be remarkably reduced. Accordingly, in view of the fact that the plasma carrier having the substrates mounted thereto is moved, it is possible to manufacture with a low cost the plasma chemical vapor deposition device which is suited for mass production.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An apparatus for forming a thin film, comprising:

housing defining a reaction chamber;

pair of electrode means securely fixed in the reaction chamber of the housing such that they are spaced from each other by a predetermined distance; and a plasma carrier detachably disposed between the pair of electrode means and having at least one substrate assembled thereto, the plasma carrier and at least one substrate cooperating with each other to delimit a glow discharge space, the plasma carrier being formed with a plurality of gas intake holes and a plurality of gas exhaust holes that communicate between the glow discharge space and the reaction chamber.

2. The apparatus for forming a thin film as claimed in claim 1, wherein a portion of the plasma carrier is made of conductive material to form a conductive part, the conductive part being electrically connected to a grounded electrode of the pair of electrode means and being electrically insulated from a power-supplied electrode of the pair of electrode means when the plasma carrier and at least one substrate are mounted between the pair of electrode means.

3. The apparatus for forming a thin film as claimed in claim 1, wherein at least one substrate is mounted or dismounted between the pair of electrode means in a state that it is assembled to the plasma carrier.

4. The apparatus for forming a thin film as claimed in claim 1, wherein the pair of electrode means each have a plate shaped configuration and are arranged such that they are parallel to each other, and the plurality of gas intake holes arid the plurality of gas exhaust holes are opposite each other, respectively.

5. The apparatus for forming a thin film as claimed in claim 1, wherein the cross-section and the plurality of the gas intake holes are equal to those of the gas exhaust holes.

6. The apparatus for forming a thin film as claimed in claim 1, wherein the plasma carrier has a rectangular hoop-shaped configuration and comprises a conductive element and a pair of insulating elements, the pair of insulating elements having one end coupled to the conductive element and the other end each being formed with a projection against which the substrate is mounted.

7. The apparatus for forming a thin film as claimed in claim 1, wherein the plasma carrier has a rectangular hoop shaped configuration and comprises a conductive element and a pair of insulating elements, each insulating element shaped as a plate with one end coupled to the conductive element and the other end to a substrate supporting member, the substrate supporting member having a protrusion against which the substrate is mounted.

8. The apparatus for forming a thin film as claimed in claim 7, wherein each insulating element is a glass plate.

9. The apparatus for forming a thin film as claimed in claim 8, wherein a glass piece having a predetermined width and length is attached to a distal end of the glass plate.

10. The apparatus for forming a thin film as claimed in claim 7, wherein at least one supporting segment is fixedly coupled to the conductive element between the pair of insulating elements of the plasma carrier to support the pair of insulating elements.

11. The apparatus for forming a thin film as claimed in claim 10, wherein the at least one supporting segment has a configuration of a hexahedron having a V-shaped recess formed in one surface thereof, the hexahedron having predetermined width, length and thickness.

12. The apparatus for forming a thin film as claimed in claim 6, wherein each insulating element of the plasma carrier has a trapezoidal cross-section and is made from a material selected from a group consisting of ceramic, heat resistant plastic, and glass.

13. The apparatus for forming a thin film as claimed in claim 1, wherein there are two substrates that are electrically insulated from each other by the plasma carrier, the apparatus adapted to be used in an RF plasma chemical vapor deposition device of a capacity-coupling type.

14. The apparatus for forming a thin film as claimed in claim 1, wherein a plasma gas supplied through the plurality of gas intake holes includes at least one compound of a silicon and halogen element.

15. An apparatus for forming a thin film, comprising:

a housing defining a reaction chamber and functioning as a ground electrode;

electrode means centrally and securely fixed in the reaction chamber of the housing such that it divides the reaction chamber into two; and a plasma carrier detachably disposed in the reaction chamber of the housing and having a rectangular hoop-shaped configuration, the plasma carrier cooperating with at least one substrate which is assembled thereto to delimit a glow discharge space, the plasma carrier being formed with a plurality of gas intake holes and a plurality of gas exhaust holes that communicate between the glow discharge space and the reaction chamber.

16. The apparatus for forming a thin film as claimed in claim 15, wherein a portion of the plasma carrier is made of conductive material to form a conductive part having two ends, each end of the conductive part is formed with a depression into which one end of a glass plate having a predetermined width and length is inserted so as to be secured therein, and wherein the other end of the glass plate is fitted with a substrate supporting member made of insulating material, the conductive part being electrically connected to the housing, and being electrically insulated from the electrode means which is adapted to be supplied with power when at least one substrate is assembled to the substrate supporting member.

17. The apparatus for forming a thin film as claimed in claim 15, wherein there are a plurality of plasma carriers, each having at least one substrate assembled on it, each plasma carrier being detachably mounted between the housing and the electrode means.

18. The apparatus for forming a thin film as claimed in claim 15, wherein the plurality of gas intake holes and the plurality of gas exhaust holes are formed such that they are opposite to each other, respectively; the cross-section and the plurality of gas intake holes are equal to those of the plurality of gas exhaust holes; and wherein there are a plurality of gas inlet spaces and a plurality of gas outlet spaces formed outside the plasma carrier.

19. An apparatus for forming a thin film, comprising:

a plurality of ground electrodes and power-supplied electrodes alternately arranged such that two adjacent electrodes are spaced from each other by a predetermined distance; and a plurality of plasma carriers each mounted between two adjacent electrodes, one being the ground electrode and the other one being the power-supplied electrode, each plasma carrier having at least one substrate assembled thereto.

* * * * *